(12) United States Patent
Kobayashi

(10) Patent No.: US 10,236,775 B2
(45) Date of Patent: Mar. 19, 2019

(54) VOLTAGE REGULATOR HAVING A TEST CIRCUIT

(71) Applicant: SII Semiconductor Corporation, Chiba-shi, Chiba (JP)

(72) Inventor: Yuji Kobayashi, Chiba (JP)

(73) Assignee: ABLIC INC., Chiba (JP)

( * ) Notice: Subject to any disclaimer, the term of this patent is extended or adjusted under 35 U.S.C. 154(b) by 23 days.

(21) Appl. No.: 15/465,886

(22) Filed: Mar. 22, 2017

(65) Prior Publication Data
US 2017/0279358 A1    Sep. 28, 2017

(30) Foreign Application Priority Data

Mar. 23, 2016 (JP) .................................. 2016-058854

(51) Int. Cl.
| | |
|---|---|
| H02M 3/158 | (2006.01) |
| G01R 17/02 | (2006.01) |
| G01R 31/40 | (2014.01) |
| H02M 1/08 | (2006.01) |
| G05F 1/56 | (2006.01) |
| G05F 1/575 | (2006.01) |
| H02M 1/00 | (2006.01) |

(52) U.S. Cl.
CPC ............ *H02M 3/158* (2013.01); *G01R 17/02* (2013.01); *G01R 31/40* (2013.01); *G05F 1/56* (2013.01); *G05F 1/575* (2013.01); *H02M 1/08* (2013.01); *H02M 2001/0009* (2013.01)

(58) Field of Classification Search
CPC . G05F 1/575; H02M 1/08; H02M 2001/0025; H02M 3/158; H02M 2001/0009; G01R 17/02; G01R 31/40
See application file for complete search history.

(56) References Cited

U.S. PATENT DOCUMENTS

| | | | |
|---|---|---|---|
| 6,828,763 B2 | 12/2004 | Sudou et al. | |
| 2006/0164021 A1* | 7/2006 | Ryu | H02M 1/08 315/209 R |

* cited by examiner

*Primary Examiner* — Henry Lee, III
(74) *Attorney, Agent, or Firm* — Brinks Gilson & Lione

(57) ABSTRACT

To provide a voltage regulator which is capable of testing a phase compensation capacitor without impairing stability as a regulator and prevents a chip area from being increased. A voltage regulator is configured to be equipped with a phase compensation capacitance test circuit for a phase compensation circuit and a negative voltage detection circuit for an external output voltage adjustment terminal and to apply a negative voltage to the external output voltage adjustment terminal to thereby start up the phase compensation capacitance test circuit, and measure the discharge time or current of a phase compensation capacitor to thereby test whether the phase compensation capacitor is good or not.

10 Claims, 5 Drawing Sheets

VOLTAGE REGULATOR HAVING A TEST CIRCUIT

RELATED APPLICATIONS

This application claims priority under 35 U.S.C. § 119 to Japanese Patent Application No. 2016-058854 filed on Mar. 23, 2016, the entire content of which is hereby incorporated by reference.

BACKGROUND OF THE INVENTION

Field of the Invention

The present invention relates to a voltage regulator having a test circuit.

Background Art

An important characteristic of a voltage regulator resides in that the voltage regulator does not oscillate.

FIG. 5 is a circuit diagram illustrating a related art voltage regulator.

The related art voltage regulator 600 is equipped with a differential amplifier circuit 60, a resistor 61 and a capacitor 62 being a phase compensation circuit, a current source 63, a voltage division resistance circuit 64, a PMOS transistor 65, an output transistor 66, and a reference voltage circuit 67.

The phase compensation circuit is stably operated with good response and even with less output capacity by generating a zero point to be formed at a low frequency (refer to, for example, Patent Document 1).

[Patent Document 1] Japanese Patent Application Laid-Open No. 2004-62374

SUMMARY OF THE INVENTION

The present invention provides a voltage regulator capable of testing a phase compensation circuit without newly providing pads for test.

In order to solve the related art problems, a voltage regulator of the present invention is configured as follows.

The voltage regulator is configured to have a first output terminal and a second output terminal and to be equipped with a voltage division circuit which is provided at the second output terminal and outputs a feedback voltage based on an output voltage; a differential amplifier which compares a reference voltage and the feedback voltage; an output transistor having a drain connected to the first output terminal and outputting the output voltage from a voltage based on a power supply voltage inputted to a source thereof and an output voltage of the differential amplifier, which is inputted to a gate thereof; a phase compensation circuit and a phase compensation capacitance test circuit provided at an output terminal of the differential amplifier; and a negative voltage detection circuit provided at the second output terminal, and to cause the negative voltage detection circuit to output a detected signal when detecting that the second output terminal is brought to a negative voltage and cause the phase compensation capacitance test circuit to discharge an electric charge charged in a phase compensation capacitor to a ground terminal in response to the detected signal of the negative voltage detection circuit.

According to a voltage regulator of the present invention, since a phase compensation capacitance test circuit is provided for a phase compensation circuit, and a negative voltage detection circuit is provided for an external output voltage adjustment terminal, a phase compensation capacitor can be tested without impairing stability as a regular, and a chip area is not increased because it is not necessary to add pads for test.

DETAILED DESCRIPTION OF THE PREFERRED EMBODIMENTS

First Embodiment

Figure 1:
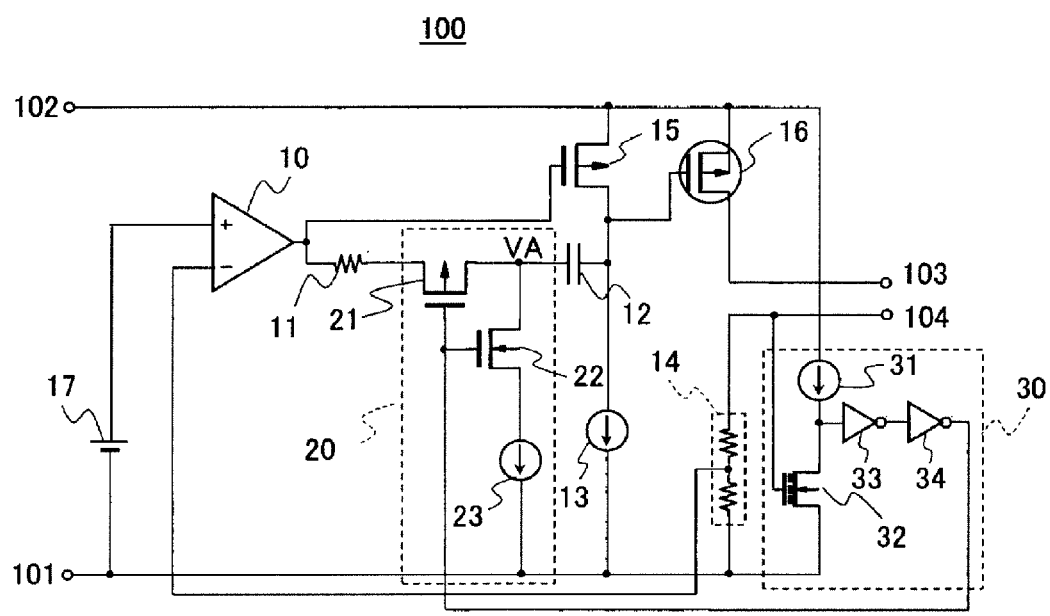
FIG. 1 is a circuit diagram illustrating one example of a voltage regulator according to a first embodiment of the present invention.

FIG. 1 is a circuit diagram illustrating one example of a voltage regulator according to a first embodiment.

The voltage regulator 100 according to the first embodiment is equipped with a reference voltage circuit 17, a differential amplifier circuit 10, a PMOS transistor 15 and a constant current circuit 13 which form an amplification stage, a voltage division circuit 14, a phase compensation resistor 11 and a phase compensation capacitor 12 to be a phase compensation circuit, an output transistor 16, a phase compensation capacitance test circuit 20, a negative voltage detection circuit 30, a ground terminal 101, a power supply terminal 102, an output terminal 103, and an external output voltage adjustment terminal 104.

The differential amplifier circuit 10 has a non-inversion input terminal connected to the reference voltage circuit 17, an inversion input terminal connected to an output terminal of the voltage division circuit 14, and an output terminal connected to a gate of the PMOS transistor 15. The phase compensation circuit and the phase compensation capacitance test circuit 20 are connected between the output terminal of the differential amplifier circuit 10 and a drain of the PMOS transistor 15. The PMOS transistor 15 and the constant current circuit 13 are connected in series between the power supply terminal 102 and the ground terminal 101. The output transistor 16 has a gate connected to the drain of the PMOS transistor 15, a source connected to the power supply terminal 102, and a drain connected to the output terminal 103. The voltage division circuit 14 is connected between the external output voltage adjustment terminal 104 and the ground terminal 101. The negative voltage detection circuit 30 is connected between the external output voltage adjustment terminal 104 and the phase compensation capacitance test circuit 20.

The phase compensation capacitance test circuit 20 is equipped with a constant current circuit 23 and switch transistors 21 and 22. The switch transistor 21 is provided between the phase compensation resistor 11 and the phase compensation capacitor 12. The switch transistor 22 and the constant current circuit 23 connected in series are provided between the phase compensation capacitor 12 and the ground terminal 101. Gates of the switch transistors 21 and 22 are respectively connected to an input terminal of the phase compensation capacitance test circuit 20. A connecting point of the phase compensation capacitor 12 and the phase compensation capacitance test circuit 20 is assumed to be a node VA.

The negative voltage detection circuit 30 is equipped with a constant current circuit 31, a depletion NMOS transistor 32, and inverter circuits 33 and 34 which form a signal. The depletion NMOS transistor 32 has a gate connected to the external output voltage adjustment terminal 104, a drain connected to the power supply terminal 102 through the constant current circuit 31, and a source connected to the ground terminal 101. The inverter circuits 33 and 34 connected in series are provided between the drain of the depletion NMOS transistor 32 and the input terminal of the phase compensation capacitance test circuit 20.

The operation of the voltage regulator 100 according to the first embodiment will next be described.

Since the voltage regulator 100 is of a general voltage three-stage amplification voltage regulator except for the negative voltage detection circuit 30 and the phase compensation capacitance test circuit 20, its detailed description will be omitted.

The negative voltage detection circuit 30 detects a voltage of the external output voltage adjustment terminal 104. Since the current of the depletion NMOS transistor 32 becomes larger than that of the constant current circuit 31 when a positive voltage is applied to the external output voltage adjustment terminal 104, the negative voltage detection circuit 30 outputs a Low signal to its output terminal. Since the current of the depletion NMOS transistor 32 becomes smaller than that of the constant current circuit 31 when a negative voltage is applied to the external output voltage adjustment terminal 104, the negative voltage detection circuit 30 outputs a High signal to its output terminal.

At the time of a normal operation, the output terminal 103 and the external output voltage adjustment terminal 104 are connected to each other. Since the positive voltage of the output terminal 103 is applied to the external output voltage adjustment terminal 104, the negative voltage detection circuit 30 outputs a Low signal to its output terminal. When the phase compensation capacitance test circuit 20 receives the Low signal therein, the switch transistor 21 is brought into an ON state and the switch transistor 22 is brought into an OFF state. Thus, since the phase compensation resistor 11 and the phase compensation capacitor 12 are connected to each other, the voltage regulator 100 is capable of ensuring the normal operation.

A description will next be made about a test of the phase compensation circuit.

The external output voltage adjustment terminal 104 is separated from the output terminal 103 and connected with a voltage source from the outside. First, a positive voltage is applied to the external output voltage adjustment terminal 104 from the voltage source, e.g., an output voltage set by the voltage regulator 100 is applied thereto to bring the voltage regulator 100 into a normal operating state.

Thereafter, the voltage of the voltage source is changed to 0V. Since the current of the depletion NMOS transistor 32 with the voltage of 0V applied to the gate thereof is larger than that of the constant current circuit 31, the negative voltage detection circuit 30 outputs a Low signal, and the phase compensation capacitance test circuit 20 is not operated. Here, since the output of the voltage division circuit 14 becomes 0V, the differential amplifier circuit 10 outputs a High signal ($\cong$VDD) and hence the PMOS transistor 15 is brought into an OFF state. Thus, since the voltage of the node VA becomes the High level ($\cong$VDD), the phase compensation capacitor 12 is charged.

After the phase compensation capacitor 12 is sufficiently charged, the voltage of the voltage source is changed to a negative voltage. Since the depletion NMOS transistor 32 is brought into an OFF state, the negative voltage detection circuit 30 outputs a High signal therefrom. Since the switch transistor 21 is turned OFF and the switch transistor 22 is turned ON, the phase compensation capacitance test circuit 20 becomes a test state. Since the node VA is connected to the constant current circuit 23 in the test state, the phase compensation capacitor 12 causes a discharge current to flow by the constant current circuit 23 until the voltage of the node VA becomes 0V. Assuming that the capacitance value of the phase compensation capacitor 12 is C, the current flowing through the constant current circuit 23 is Ic, and the voltage of the power supply terminal 102 is VDD, a time Tt at which the current flows is represented by the following equation:

$Tt = C \times (VDD)/Ic$

Accordingly, a test for a connection failure in the phase compensation capacitor 12 is made possible by measuring the time Tt at which the current Ic flows, from current consumption of the entire circuit.

A nondefective product determination is made possible by, for example, as described above, measuring current consumption before and after the voltage of the external voltage source is switched to perform switching to the negative voltage, and assuming a period in which current consumption is increased by the current Ic of the constant current circuit 23 to be a desired time Tt.

Also, for example, when there is no difference between current consumption measured before and after the voltage of the external voltage source is switched to the negative voltage, it is possible to detect a connection failure of a contact of the phase compensation capacitor 12.

As described above, the voltage regulator 100 according to the first embodiment is capable of testing the phase compensation capacitor 12 without impairing stability as a regulator and prevents the area of a chip from being increased because it is not necessary to add pads for test. Further, since the external output voltage adjustment terminal 104 is used, the voltage regulator can be tested even in a shipment inspection after being assembled into a package.

Figure 2:
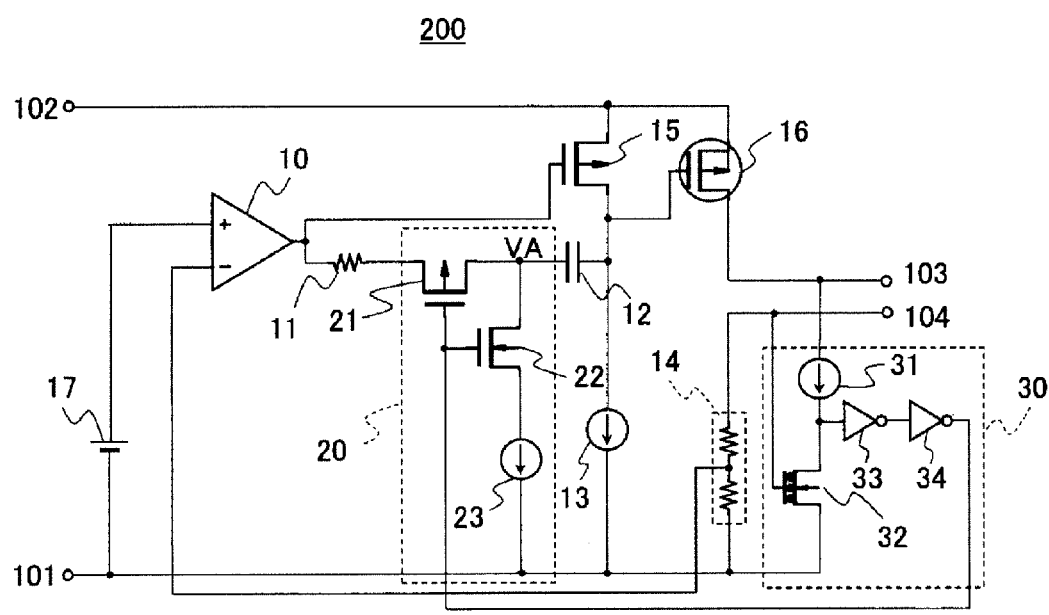
FIG. 2 is a circuit diagram illustrating another example of the voltage regulator according to the first embodiment of the present invention.

FIG. 2 is a circuit diagram illustrating another example of the voltage regulator according to the first embodiment of the present invention.

As illustrated in the voltage regulator 200 of FIG. 2, a constant current circuit 31 of a negative voltage detection circuit 30 may be connected to an output terminal 103 rather than a power supply terminal 102.

With such a configuration, there is an effect that when the negative voltage detection circuit 30 detects a negative voltage, the current of the constant current circuit 31 does not affect current consumption. Further, there can be obtained an effect that the constant current circuit 31 is connected to the output terminal 103 to thereby perform a role as an output load at the time of a normal operation and stabilize an output voltage at the time of no load. Moreover, there is also an effect that it is possible to suppress a rise in the output voltage due to a leak current of an output transistor 16 at a high temperature.

Second Embodiment

Figure 3:
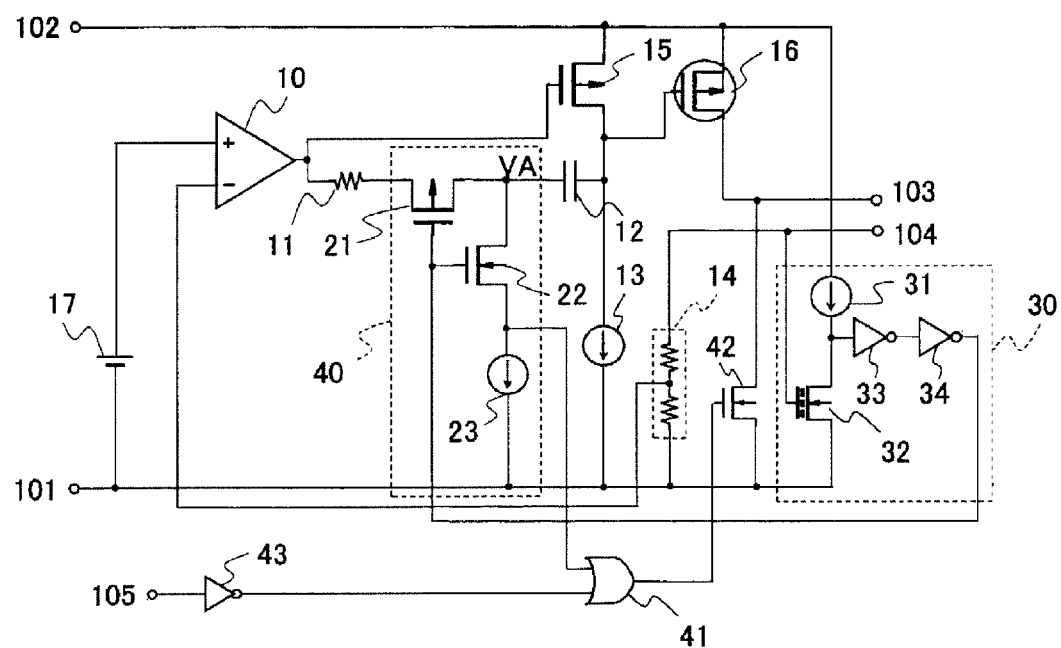
FIG. 3 is a circuit diagram illustrating one example of a voltage regulator according to a second embodiment of the present invention.

FIG. 3 is a circuit diagram illustrating one example of a voltage regulator according to a second embodiment of the present invention. In the voltage regulator 300 according to the second embodiment, the phase compensation capacitance test circuit 20 is changed to a phase compensation capacitance test circuit 40 from the voltage regulator 100 of FIG. 1, and further, an ONOFF terminal 105, an OR circuit 41, an NMOS transistor 42, and an inverter circuit 43 are added.

In the phase compensation capacitance test circuit 40, a connecting point of a switch transistor 22 and a constant current circuit 23 is assumed to be an output terminal. The inverter circuit 43 has an input terminal connected to the ONOFF terminal 105. The OR circuit 41 has an input terminal to which an output terminal of the inverter circuit 43 and the output terminal of the phase compensation capacitance test circuit 40 are connected, and an output terminal connected to a gate of the NMOS transistor 42. The NMOS transistor 42 has a drain connected to an output terminal 103, and a source connected to a ground terminal 101.

At the time of a normal operation, the ONOFF terminal 105 is inputted with a High signal, and the inverter circuit 43 outputs a Low signal. The phase compensation capacitance test circuit 40 outputs a Low signal from the output terminal. Thus, the OR circuit 41 outputs the Low signal and the NMOS transistor 42 is OFF.

Further, when a Low signal is inputted to the ONOFF terminal 105, the OR circuit 41 outputs a High signal to turn ON the NMOS transistor 42, thereby discharging the electric charge of an external output capacitor.

Since the switch transistor 22 is turned ON when testing a phase compensation circuit, the signal outputted depending on the state of a phase compensation capacitor 12 changes at the output terminal of the phase compensation capacitance test circuit 40.

Since the voltage of a node VA is at High when the state of the phase compensation capacitor 12 is normal, the phase compensation capacitance test circuit 40 outputs a High signal from its output terminal. The OR circuit 41 outputs the High signal to bring the NMOS transistor 42 into an ON state. At this time, since a current flows from the output terminal 103 to the NMOS transistor 42, current consumption is increased.

Since, in the case of a connection failure of the phase compensation capacitor 12, the phase compensation capacitance test circuit 40 outputs a Low signal from its output terminal and thereby the NMOS transistor 42 maintains an OFF state, current consumption is not increased.

Thus, since the voltage regulator 300 determines good or bad quality of the phase compensation capacitor 12 depending on the magnitude of current consumption, it is possible to easily perform a test therefor.

As described above, since the voltage regulator of the present invention is equipped with the phase compensation capacitance test circuit for the phase compensation circuit, and the negative voltage detection circuit for the external output voltage adjustment terminal, the phase compensation capacitor can be tested without impairing stability as the regulator. Since there is no need to add the pads for test, the chip area is not increased. Further, since the external output voltage adjustment terminal is used, the voltage regulator can be tested even in a shipment inspection after being assembled into a package.

Incidentally, the voltage regulator of the present invention is not limited to the above-described circuit diagrams, but can be modified in various ways within the scope not departing from the gist of the present invention.

Figure 4:
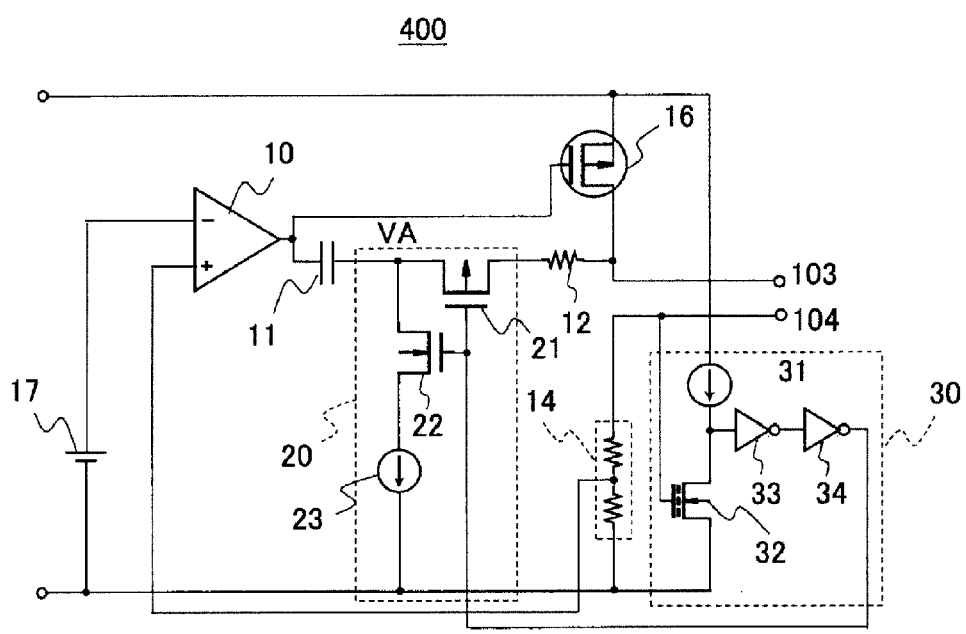
FIG. 4 is a circuit diagram illustrating one example of a two-stage amplification voltage regulator of the present invention.
Figure 5:
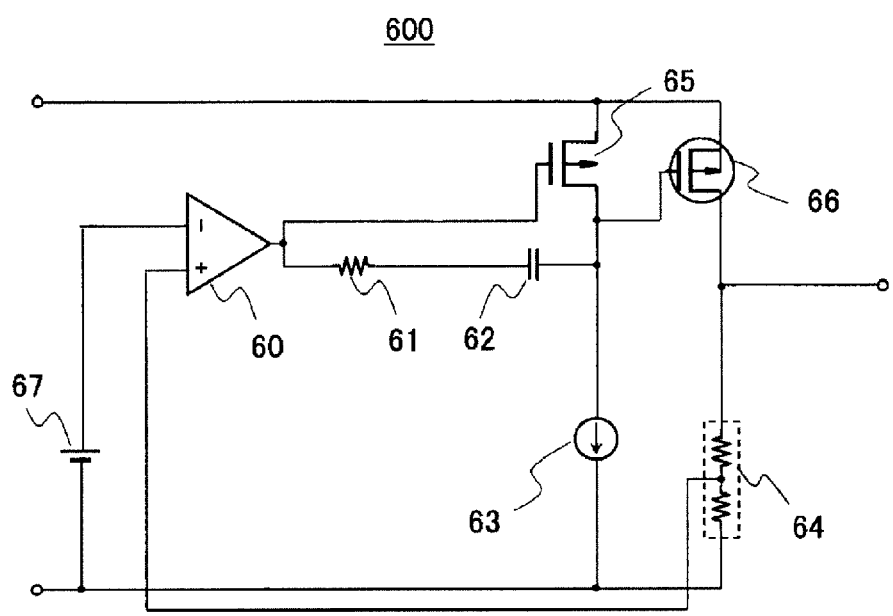
FIG. 5 is a circuit diagram illustrating a related art voltage regulator.

For example, although the above embodiment has described the voltage three-stage amplification voltage regulator by way of example, a voltage two-stage amplification voltage regulator may be adopted. A circuit diagram of a voltage regulator 400 is illustrated in FIG. 4 as an example in which the present invention is applied to a two-stage amplification voltage regulator.

What is claimed is:

1. A voltage regulator equipped with a first output terminal and a second output terminal, comprising:
   a voltage division circuit connected to the second output terminal and that outputs a feedback voltage based on an output voltage;
   a differential amplifier that compares a reference voltage and the feedback voltage;
   an output transistor having a drain connected to the first output terminal and a source connected to a power supply voltage and outputting the output voltage from a voltage based on the power supply voltage and an output voltage of the differential amplifier input to a gate of the output transistor;
   a phase compensation circuit and a phase compensation capacitance test circuit connected to an output terminal of the differential amplifier; and
   a negative voltage detection circuit that outputs a detected signal when detecting that the second output terminal has a negative voltage,
   wherein, in response to the detected signal of the negative voltage detection circuit, the phase compensation capacitance test circuit discharges an electric charge in a phase compensation capacitor of the phase compensation circuit to a ground terminal.

2. The semiconductor device according to claim 1, further comprising a plurality of smaller slits extending in the first direction.

3. The semiconductor device according to claim 1;
   wherein the second interconnect comprises a plurality of second interconnects on one side of the first interconnect, and
   wherein the slit comprises a plurality of slits each along the first coupling portion between the first interconnect and the one end of each of the plurality of second interconnects.

4. The semiconductor device according to claim 1, further comprising a third interconnect coupled to another end of the second interconnect on an opposite side to the one end.

5. The semiconductor device according to claim 1, further comprising a VIA contact at another end of the second interconnect on an opposite side to the one end.

6. A semiconductor device, comprising:
   a semiconductor substrate;
   an insulating film on a surface of the semiconductor substrate;
   a pad on the insulating film and having a first width in a first direction and a second width in a second direction, the second direction orthogonal to the first direction;
   a second interconnect having a third width in the first direction, wherein the third width is smaller than the first width and the second width, and the second interconnect is coupled to the first interconnect at a first coupling portion between the first interconnect and one end of the second interconnect, the first coupling portion extending in the first direction; and
   a slit in the pad at a location away from the first coupling portion by a length of the third width or more, and having a fourth width which is half or more of the third width in the first direction, wherein the fourth width of the slit is symmetrical with respect to the first coupling portion.

7. The semiconductor device according to claim 6, further comprising a plurality of smaller slits in the first direction.

8. The semiconductor device according to claim 6;
wherein the second interconnect comprises a plurality of second interconnects on one side of the pad, and
wherein the slit comprises a plurality of slits each along the first coupling portion between the pad and the one end of each of the plurality of second interconnects.

9. The semiconductor device according to claim 6, further comprising a third interconnect coupled to another end of the second interconnect on an opposite side to the one end.

10. The semiconductor device according to claim 6, further comprising a VIA contact at another end of the second interconnect on an opposite side to the one end.

* * * * *